United States Patent
Miura et al.

(10) Patent No.: US 9,941,431 B2
(45) Date of Patent: Apr. 10, 2018

(54) PHOTODIODE HAVING A SUPERLATTICE STRUCTURE

(71) Applicant: SUMITOMO ELECTRIC INDUSTRIES, LTD., Osaka (JP)

(72) Inventors: Kohei Miura, Yokohama (JP); Yasuhiro Iguchi, Yokohama (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/373,318

(22) Filed: Dec. 8, 2016

(65) Prior Publication Data
US 2017/0170347 A1 Jun. 15, 2017

(30) Foreign Application Priority Data
Dec. 9, 2015 (JP) ................................. 2015-240471

(51) Int. Cl.
| | | |
|---|---|---|
| *H01L 31/10* | (2006.01) | |
| *H01L 31/0352* | (2006.01) | |
| *H01L 31/0304* | (2006.01) | |
| *H01L 31/109* | (2006.01) | |
| *H01L 31/105* | (2006.01) | |

(52) U.S. Cl.
CPC .. *H01L 31/035236* (2013.01); *H01L 31/0304* (2013.01); *H01L 31/03042* (2013.01); *H01L 31/105* (2013.01); *H01L 31/109* (2013.01); *Y02E 10/544* (2013.01)

(58) Field of Classification Search
CPC ........... H01L 31/03523; H01L 31/0304; H01L 31/109
See application file for complete search history.

(56) References Cited

U.S. PATENT DOCUMENTS

| | | | | | |
|---|---|---|---|---|---|
| 4,803,141 | A | * | 2/1989 | Yoshizawa | B82Y 20/00 257/E31.034 |
| 5,187,553 | A | * | 2/1993 | Makita | B82Y 20/00 257/187 |
| 5,204,539 | A | * | 4/1993 | Tsuji | B82Y 20/00 257/185 |
| 5,442,203 | A | * | 8/1995 | Adomi | H01L 33/10 257/97 |
| 5,521,935 | A | * | 5/1996 | Irikawa | B82Y 20/00 257/18 |
| 5,847,409 | A | * | 12/1998 | Nakayama | H01L 29/155 257/15 |

(Continued)

OTHER PUBLICATIONS

N. Gautum, et al., "Performance Improvement of Longwave Infrared Photodetector Based on Type-II InAs/GaSb Superlattices using Unipolar Current Blocking Layers", *Applied Physics Lettters*, 96, 213307 p. 231107-1-p. 231107-3, Jun. 8, 2010.

*Primary Examiner* — Ida M Soward
(74) *Attorney, Agent, or Firm* — Smith, Gambrell & Russell, Ltd.

(57) ABSTRACT

A photodiode includes a light absorbing layer including a first superlattice structure that includes first semiconductor layers and second semiconductor layers, the first superlattice structure having a band structure sensitive to infrared light; a p-type semiconductor region; and an intermediate layer disposed between the p-type semiconductor region and the light absorbing layer, the intermediate layer having a conduction band having a bottom energy level lower than that of the p-type semiconductor region.

10 Claims, 9 Drawing Sheets

(56) References Cited

U.S. PATENT DOCUMENTS

| | | | | |
|---|---|---|---|---|
| 7,583,715 B2* | 9/2009 | Hill | ............................ | H01S 5/20 |
| | | | | 372/43.01 |
| 8,674,406 B2* | 3/2014 | Scott | ....................... | B82Y 20/00 |
| | | | | 250/338.4 |
| 9,040,817 B2* | 5/2015 | Sakai | ...................... | B82Y 10/00 |
| | | | | 136/255 |
| 9,064,992 B1* | 6/2015 | Nosho | ................ | H01L 31/02016 |
| 9,640,616 B2* | 5/2017 | Augusto | ............... | H01L 29/155 |
| 2009/0272903 A1* | 11/2009 | Kato | ...................... | B82Y 20/00 |
| | | | | 250/338.4 |
| 2010/0072457 A1* | 3/2010 | Iguchi | .................... | B82Y 20/00 |
| | | | | 257/21 |
| 2015/0214402 A1* | 7/2015 | Yoshikawa | ........ | H01L 31/03521 |
| | | | | 136/262 |
| 2015/0255672 A1* | 9/2015 | Shur | ........................ | H01L 33/06 |
| | | | | 257/13 |
| 2015/0364628 A1* | 12/2015 | Nozawa | .............. | H01L 31/0304 |
| | | | | 136/255 |
| 2017/0207304 A1* | 7/2017 | Augusto | ............... | H01L 29/155 |

* cited by examiner

PHOTODIODE HAVING A SUPERLATTICE STRUCTURE

BACKGROUND OF THE INVENTION

Field of the Invention

The present invention relates to a photodiode sensitive to infrared light. This application claims the benefit of priority from Japanese Patent Application No. 2015-240471 filed on Dec. 9, 2015, which is herein incorporated by reference in its entirety.

Related Background Art

Non-Patent Document 1 (APPLIED PHYSICS LETTERS 96, 231107 (2010)) discloses an infrared light detector having a current blocking layer.

SUMMARY OF THE INVENTION

A photodiode according to an aspect of the present invention includes a light absorbing layer including a first superlattice structure that includes first semiconductor layers and second semiconductor layers, the first superlattice structure having a band structure sensitive to infrared light; a p-type semiconductor region; and an intermediate layer disposed between the p-type semiconductor region and the light absorbing layer, the intermediate layer having a conduction band having a bottom energy level lower than that of the p-type semiconductor region.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

DETAIL DESCRIPTION OF EMBODIMENTS

An infrared image sensor operable in a wavelength ranging from 3 to 5 micrometers is used in temperatures lower than 80 degrees Kelvin (K). The inventors' teachings reveals that such an infrared image sensor that can operate in higher temperatures is desired but that the infrared image sensor operating in the higher temperatures would exhibit a higher dark current. Non-Patent Document 1 teaches adding a barrier layer to a photodiode in an image sensor.

Specific embodiments according to the above aspects are described below.

A photodiode according to an embodiment includes a light absorbing layer including a first superlattice structure that includes first semiconductor layers and second semiconductor layers, the first superlattice structure having a band structure sensitive to infrared light; a p-type semiconductor region; and an intermediate layer disposed between the p-type semiconductor region and the light absorbing layer, the intermediate layer having a conduction band having a bottom energy level lower than that of the p-type semiconductor region.

In the above photodiode, the intermediate layer has a bottom energy level of the conduction band lower than that of the p-type semiconductor region, so that the intermediate layer provided with the well potential may trap electrons flowing in the direction from the p-type semiconductor region to the light absorbing layer, thereby reducing the number of electrons that pass through the light absorbing layer and the n-type semiconductor region to reach the n-side electrode. The intermediate layer, which may provide the well potential to electrons, may prevent electrons from reaching the n-side electrode from the p-type semiconductor region, resulting in the reduction of dark current.

In the photodiode according to an embodiment, preferably, the first superlattice structure of the light absorbing layer has an array of unit cells each of which includes the first semiconductor layers and the second semiconductor layers. Each of the first semiconductor layers of the first superlattice structure contains gallium as group III element, and antimony as group V element. Each of the second semiconductor layers of the first superlattice structure contains indium as group III element, and arsenic as group V element. The intermediate layer includes a second superlattice structure having an array of unit cells each of which includes the first semiconductor layers and the second semiconductor layers. The conduction band of the intermediate layer is provided by the second superlattice structure. Each of the first semiconductor layers of the second superlattice structure contains gallium as group III element, and antimony as group V element. In addition, each of the second semiconductor layers of the second superlattice structure contains indium as group III element, and arsenic as group V element.

In the photodiode, the first superlattice structure containing the above constituent elements makes it easy to enable the type-II band structure, and the second superlattice structure containing the above constituent elements makes it easy to enable the well potential suitable for the band structure of the light absorbing layer.

In the photodiode according to an embodiment, preferably, the p-type semiconductor region has a conduction band provided by a third superlattice structure. The conduction band of the intermediate layer has a bottom energy level lower than that of the light absorbing layer.

In the photodiode, the third superlattice structure of the p-type semiconductor region makes it easy to enable a well potential to the light absorption layer and the p-type semiconductor region, and makes it easy to form the valence band that does not significantly prevent the arrangement of the intermediate layer and the p-type semiconductor region from impeding the flow of holes of the electron-hole pairs that the light absorbing layer generates by photoelectric conversion.

In the photodiode according to an embodiment, the intermediate layer has a p-type conductivity.

The photodiode allows the p-type conductivity of the intermediate layer to reduce the band offset of the valence band in the intermediate layer.

The teachings of the present invention can be readily understood by considering the following detailed description with reference to the accompanying drawings shown as examples.

Referring to the accompanying drawings, embodiments of a photodiode according to the aspects of the present invention will be illustrated below. When possible, the same portions will be denoted by the same reference numerals.

Figure 1:
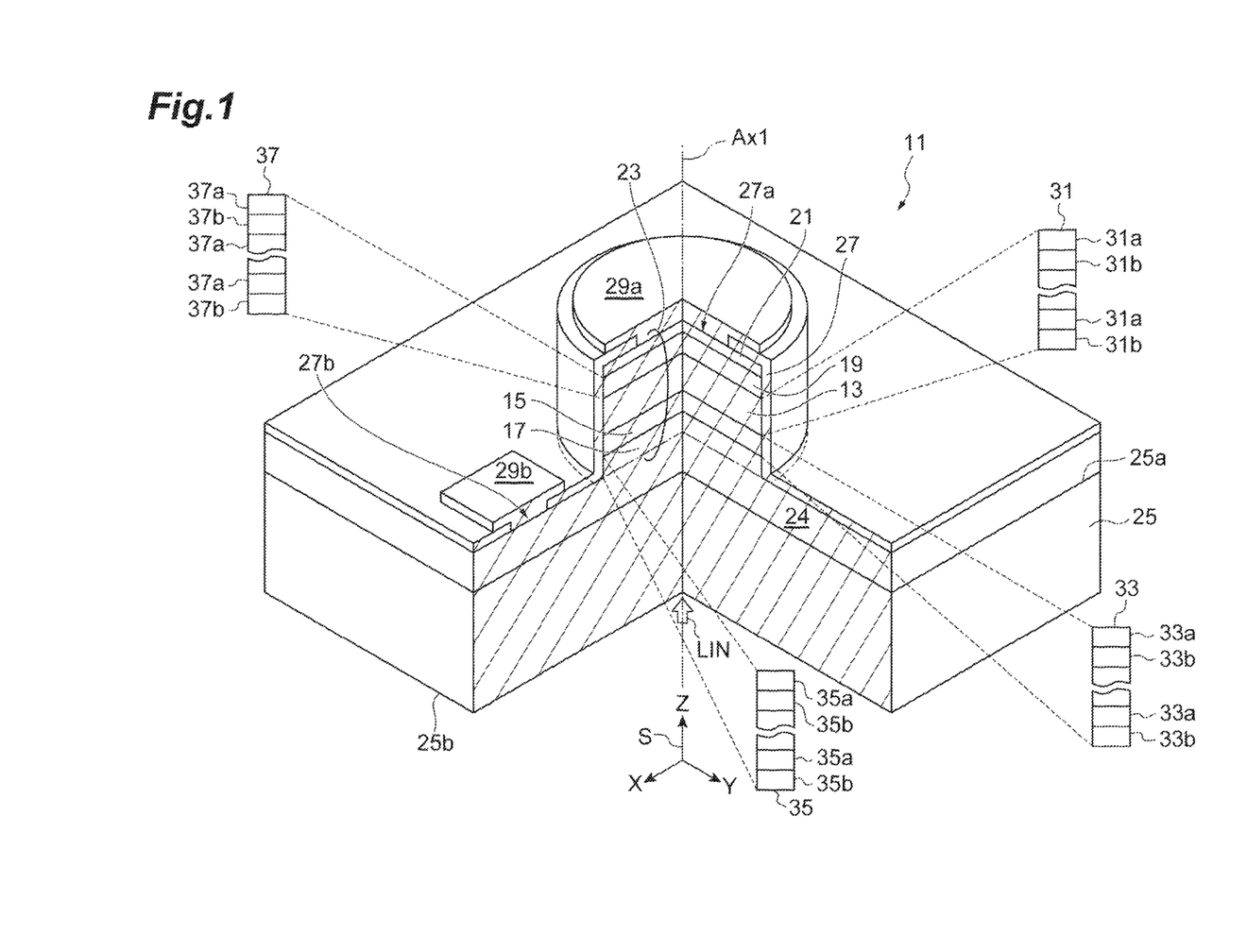
FIG. 1 is a view showing a photodiode according to the present embodiment.
Figure 2:
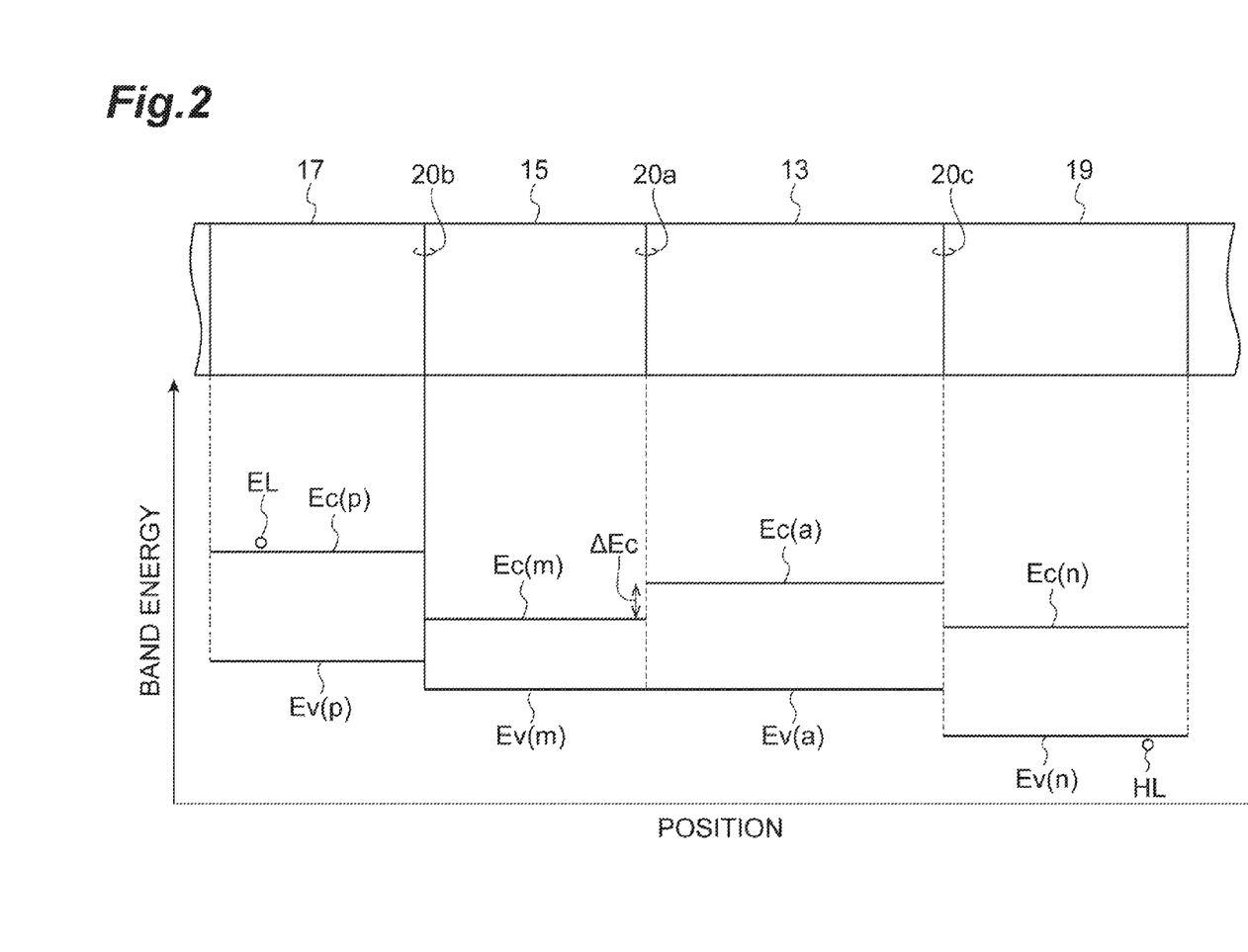
FIG. 2 is a view showing a band diagram of the photodiode shown in FIG. 1.

FIG. 1 is a view showing a photodiode according to the present embodiment. FIG. 2 is a view showing a band diagram in the photodiode shown in FIG. 1. The photodiode 11 includes a light absorbing layer 13, an intermediate layer 15, a p-type semiconductor region 17 and an n-type semiconductor region 19. The light absorbing layer 13 includes a first superlattice structure 31, which includes first semiconductor layers 31a and second semiconductor layers 31b arranged to form a band structure allowing the photodiode to be sensitive to infrared radiation. The light absorbing layer 13 is disposed between the p-type semiconductor region 17 and the n-type semiconductor region 19. The p-type semiconductor region 17 includes a III-V compound semiconductor, which comprises a p-type dopant (e.g., beryllium). The intermediate layer 15 is disposed between the light absorbing layer 13 and the p-type semiconductor region 17. The n-type semiconductor region 19 includes a III-V compound semiconductor, which includes an n-type dopant (e.g., silicon). As shown in FIG. 2, the energy level Ec(m) at the bottom of the conduction band of the intermediate layer 15 is lower than the energy level Ec(p) at the bottom of the conduction band of the p-type semiconductor region 17. The first superlattice structure 31 provides the light absorbing layer 13 with the energy level Ec(a) at the bottom of the conduction band and the energy level Ev(a) at the bottom of the valence band thereof.

The photodiode 11 provides the light absorbing layer 13 with a band structure allowing the light absorbing layer to be sensitive to infrared light, and can detect the infrared light incident on the photodiode 11 to generate a photocurrent by the photoelectric effect. Electrons EL in the p-type semiconductor region 17 flow through the conduction band of the p-type semiconductor region 17 toward the n-type semiconductor region 19. Holes HL in the n-type semiconductor region 19, flow through the valence band of the n-type semiconductor region 19 toward the p-type semiconductor region 17. Inventors' teachings reveal that if the electrons EL can be generated in the semiconductor region, for example, the p-type semiconductor region 17 in the photodiode 11 to reach the n-side electrode through the light absorbing layer 13 and the n-type semiconductor region 19, this carrier traveling results in increase in the dark current in the photodiode 11. As shown in FIG. 1, the photodiode 11 includes the intermediate layer 15 provided between the light absorbing layer 13 and the p-type semiconductor region 17, and as shown in FIG. 2, the intermediate layer 15 is provided with the energy level Ec(m) at the bottom of the conduction band lower than the energy level Ec(p) at the bottom of the conduction band of the p-type semiconductor region 17, so that the intermediate layer 15 enables a well potential acting on electrons from the p-type semiconductor region 17. The electrons EL, which may flow from the p-type semiconductor region 17 toward the light absorbing layer 13, are trapped by the well potential of the intermediate layer 15 to reduce the number of electrons reaching the light absorbing layer 13. The intermediate layer 15 that can provide an effective well potential to electrons can reduce dark current generated by the recombination in the light-absorbing layer 13. Electrons trapped in the well potential in the conduction band of the intermediate layer 15 recombines with holes in the valence band of the intermediate layer 15, so that electron-hole annihilation occurs. The thickness of the intermediate layer 15 can be, for example, 100 to 1000 nm. The intermediate layer 15 having a thickness of less than 100 nm makes an energy level of the intermediate layer 15 shallower, and the shallower energy level facilitate the trapped electrons to be easily excited to the light absorbing layer 13, and also makes reduction in dark current less-effective. The intermediate layer 15 having a thickness of more than 1000 nm absorbs almost incident light before the light reaches the light absorbing layer 13, lowering the sensitivity of the photodiode 11.

In the photodiode 11 shown in FIG. 1, the p-type semiconductor region 17, the light absorbing layer 13, the intermediate layer 15, the n-type semiconductor region 19 and the n-type contact layer 21 are arranged in the direction of the first axis Ax1, and the first axis Ax1 is oriented in the direction of the Z axis of an orthogonal coordinate system S. Further, the p-type semiconductor region 17, the light absorbing layer 13, the intermediate layer 15, the n-type semiconductor region 19 and the n-type contact layer 21 constitute a semiconductor mesa 23. The semiconductor mesa 23 is mounted on another p-type semiconductor region 24, which is provided on the principal surface 25a of the substrate 25. The substrate 25 includes a III-V compound semiconductor, such as, GaSb, InAs, InP, and GaAs. The substrate 25 has a thickness of, for example, 200 to 700 micrometers. The principal surface 25a of the substrate 25 extends in the directions of the X- and Y-axes of the orthogonal coordinate system S. The surfaces of the p-type semiconductor region 24 and the semiconductor mesa 23 are covered with an insulating film 27, which includes a silicon-based inorganic insulating film, such as a silicon oxide film. The insulating film 27 includes a first opening 27a disposed on the top of the semiconductor mesa 23, and the top of the semiconductor mesa 23 forms a contact with the first electrode 29a through the first opening 27a. The insulating film 27 also includes a second opening 27b disposed on the surface of the other p-type semiconductor region 24, which forms a contact with a second electrode 29b through the second opening 27b. In the present embodiment, the first electrode 29a serves as a cathode electrode, and the second electrode 29b serves as the anode electrode, and the photodiode 11 allows the light absorbing layer 13 to detect incident light LIN through the backside 25b of the substrate 25.

FIG. 1 shows the single photodiode 11, but a photodiode according to the present embodiment may include a one-dimensional or two-dimensional array of photodiodes each of which may be substantially the same as the above photodiode 11. These arrays can be used for infrared image sensors.

In an embodiment of the photodiode 11, the first superlattice structure 31 of the light absorbing layer 13 may have an arrangement of unit cells, each of which includes first semiconductor layers 31a and second semiconductor layers 31b. The bottom energy level Ec(a) of the conduction band and the bottom energy level Ev(a) of the valence band in the light absorbing layer 13 are provided by the first superlattice structure 31. Each of the first semiconductor layers 31a is made of a binary or ternary III-V compound semiconductor containing antimony as a group V constituent element and gallium as a group III constituent element, and the group III-V compound semiconductor may be undoped. Each of the second semiconductor layers 31b is made of a binary or ternary III-V compound semiconductor containing indium as a Group III constituent element and arsenic as a group V constituent element, and the III-V compound semiconductor is undoped or doped with p-type impurity. The first superlattice structure 31 of the above constituent elements makes it easy to enable a type-II band structure.

The intermediate layer 15 comprises a second superlattice structure 33 including first semiconductor layers 33a and second semiconductor layers 33b. The bottom energy level Ec(m) of the conduction band and the bottom energy level Ev(m) of the valence band of the intermediate layer 15 are provided by the second superlattice structure 33. Each of the first semiconductor layers 33a is made of a binary or ternary III-V compound semiconductor containing gallium as a group III constituent element and antimony as a group V constituent element, and the group III-V compound semiconductor can be, for example, undoped or doped with p-type impurity. Each of the second semiconductor layers 33b includes a binary or ternary III-V compound semiconductor containing indium as a Group III constituent element and arsenic as a group V constituent element, and the group III-V compound semiconductors can be, for example, undoped or doped with p-type impurity. The second superlattice structure 33 comprising the above constituent elements makes it easy to enable a well potential which is aligned with the band structure (the energy levels Ec(a), Ev(a)) of the light-absorbing layer by adjusting the thicknesses of the first semiconductor layers 33a and the second semiconductor layers 33b. As shown in FIG. 2, the light absorbing layer 13 can provide a barrier ΔEc to electron in the conduction band of the intermediate layer 15. The barrier ΔEc prevents electrons in the intermediate layer 15 from moving to the conduction band of the light absorbing layer 13.

The p-type semiconductor region 17 includes the third superlattice structure 35, which includes first semiconductor layers 35a and second semiconductor layers 35b. The energy level Ec(p) of the conduction band and the energy level Ev(p) of the valence band of the p-type semiconductor region 17 are provided by the third superlattice structure 35. Each of the first semiconductor layers 35a is made of a binary or ternary III-V compound semiconductor containing gallium as a group III constituent element and antimony as a group V constituent element, and each of the group III-V compound semiconductors may be doped with, for example, beryllium to have a p-type conductivity. Each of the second semiconductor layers 35b includes a binary or ternary III-V compound semiconductor containing indium as a Group III constituent element and arsenic as a group V constituent element, and the group III-V compound semiconductor may be doped with, for example, beryllium to have a p-type conductivity. The third superlattice structure 35 comprising the above constituent elements makes it easy to enable the conduction band and the valence band having energy levels aligned with the band structure of the light absorbing layer 13. The conduction band of the intermediate layer 15 has a bottom energy level Ec(m) lower than the bottom energy level Ec(p) of the conduction band of the p-type semiconductor region 17 and the bottom energy level Ec(a) of the conduction band of the light absorbing layer 13.

The photodiode 11 allows the light absorbing layer 13, as shown in FIG. 2, to provide an energy barrier to electrons trapped in the intermediate layer 15, and the energy barrier can prevent electrons in the intermediate layer 15 from reaching the light absorbing layer 13 by thermal excitation. The second superlattice structure 33 of the intermediate layer 15 makes it easy for the intermediate layer 15 to enable a well potential to the light absorbing layer 13 and the p-type semiconductor region 17, and makes it easy for the arrangement of the intermediate layer 15 and the p-type semiconductor region 17 to have the respective valence bands that do not significantly prevent holes of the electron-hole pairs, which the light absorbing layer generates by photoelectric conversion, from flowing therethrough. In the present embodiment, the intermediate layer 15 is disposed between the light absorbing layer 13 and the p-type semiconductor region 17 so as to form a first junction 20a with the p-type semiconductor region 17 and form a second joint 20b with the light absorbing layer 13. The light absorbing layer 13 may form a third junction 20c with the n-type semiconductor region 19, but the present embodiment is not limited thereto.

The n-type semiconductor region 19 includes a fourth superlattice structure 37, which includes first semiconductor layers 37a and second semiconductor layers 37b. The energy level Ec(n) of the conduction band and the energy level Ev(n) of the valence band of the p-type semiconductor region 17 is provided by the fourth superlattice structure 37. Each of the first semiconductor layers 37a includes a binary or ternary III-V compound semiconductor containing gallium as a group III constituent element and antimony as a group V constituent element, and the group III-V compound semiconductor is undoped. Each of the second semiconductor layers 37b includes a binary or ternary III-V compound semiconductor containing indium as a Group III constituent element and arsenic as a group V constituent element, and the group III-V compound semiconductor is doped with silicon to have an n-type conductivity. The fourth superlattice structure 37 with the above constituent elements makes it easy to enable respective energy levels in the conduction and valence bands aligned with the band structure of the light absorbing layer.

The fourth superlattice structure 37 makes it easy to provide the n-type semiconductor region 19 with a valence band which does not significantly prevent holes of electron-hole pairs, which the light absorbing layer 13 generates by photoelectric conversion, from flowing through the arrangement of the light absorbing layer 13 and the n-type semiconductor region 19.

Figure 3:
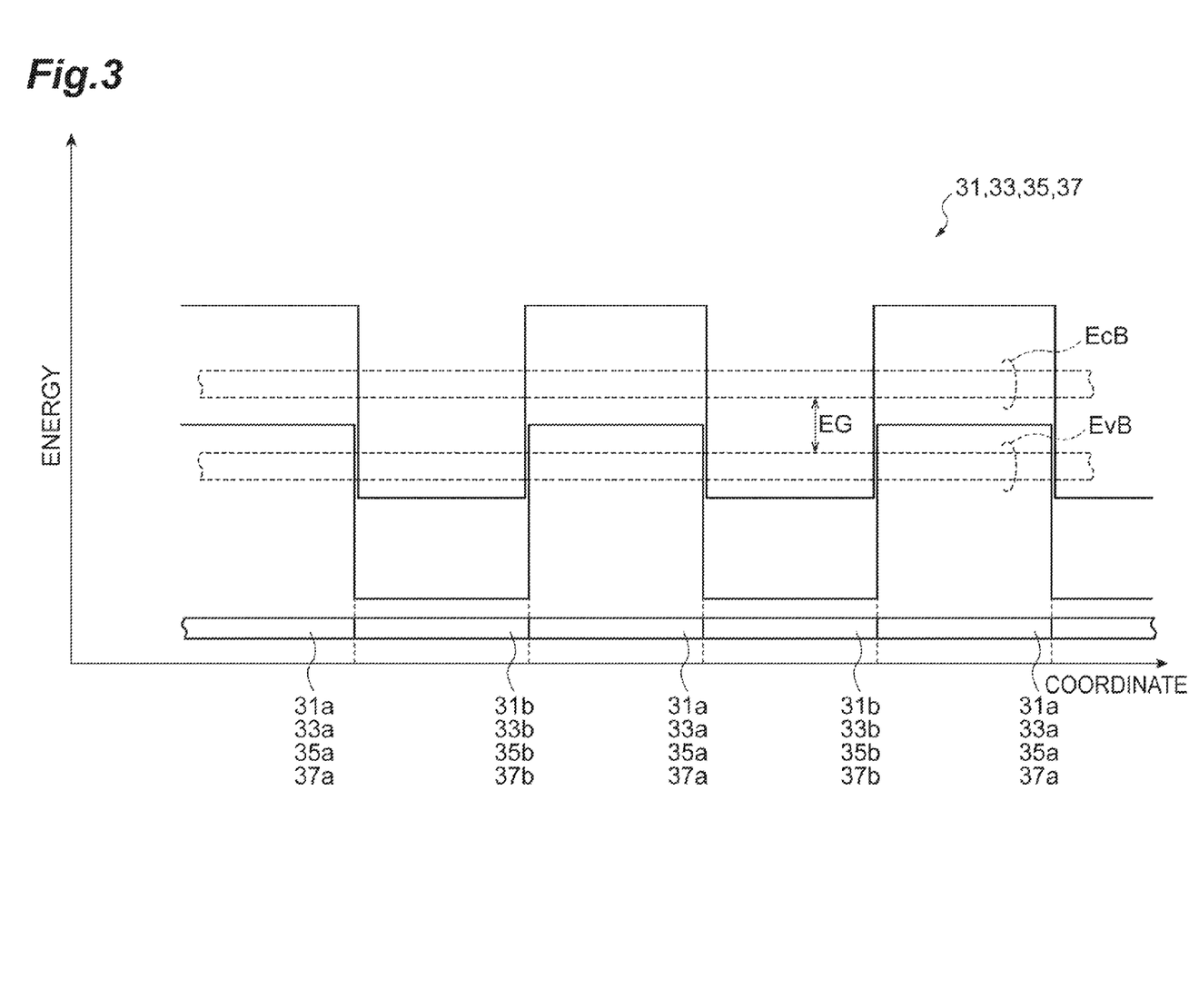
FIG. 3 is a schematic view showing a band structure of type II, which can be applied to each of the first superlattice structure to the fourth superlattice structure.

Each of the first superlattice structure 31 to the fourth superlattice structure 37 has a type-II band structure as shown in FIG. 3. The individual superlattice structure forms a conduction band EcB and a valence band EvB, which are indicated by the dashed line in FIG. 3. The energy difference between the bottom of the conduction band EcB and the bottom of the valence band EvB corresponds to a band gap EG. The bandgap EG is small enough to sense infrared radiation to the light absorbing layer, and can be, for example, 0.08 to 0.25 electron volts.

An exemplary photodiode 11.
Cell for the first superlattice structure 31 of the light absorbing layer 13: InSb (a thickness of 0.27 nm)/InAs (a thickness of 2.74 nm)/GaSb (a thickness of 2.13 nm).
The number of cells stacked: 200.
Cell for the second superlattice structure 33 of the intermediate layer 15: InSb (a thickness of 0.27 nm)/InAs (a thickness of 5.06 nm)/InSb (a thickness of 0.27 nm)/GaSb (a thickness of 2.13 nm).

The number of cells stacked: 52.
Cell for the third superlattice structure 35 of the p-type semiconductor region 17: InSb (a thickness of 0.27 nm)/InAs (a thickness of 2.74 nm)/GaSb (a thickness of 2.13 nm).
The number of cells stacked: 50.
Cell for the fourth superlattice structure 37 of the n-type semiconductor region 19: InSb (a thickness of 0.27 nm)/InAs (a thickness of 2.74 nm)/GaSb (a thickness of 2.13 nm).
The number of cells stacked: 50 cell.
N-type contact layer 21: InAs (a thickness of 20 nm).
Other p-type semiconductor region 24: Be-doped GaSb (a thickness: of 1000 nm).
Group III-V compound semiconductor substrate 25: Te-doped n-type GaSb.
The light absorbing layer 13 may include a bulk layer of InAsSb.
This InAsSb layer has such a thickness as to prevent the light absorbing layer 13 from forming a discrete quantum level, and can sense infrared radiation.

The difference between an energy level at the bottom of the valence band of the intermediate layer 15 and an energy level at the bottom of the valence band of the light absorbing layer 13 (i.e., band offset) is 52 milli-electron volts or less (which is approximately 3 $k_B T$ at an absolute temperature of 200K, where "$k_B$" indicates Boltzmann's constant, k=8.6171×10$^{-5}$ in electron volts). The band offset of the valence band in the above embodiment is four milli-electron volts.

The difference between an energy level at the bottom of the conduction band of the intermediate layer 15 and an energy level at the bottom of the conduction band of the light absorbing layer 13 (band offset) is 52 milli-electron volts or more (which is approximately 3 $k_B T$ at an absolute temperature of 200 K, where "$k_B$" indicates Boltzmann's constant). The band offset of the conduction band in the above embodiment is 124 milli-electron volts.

Figure 4:
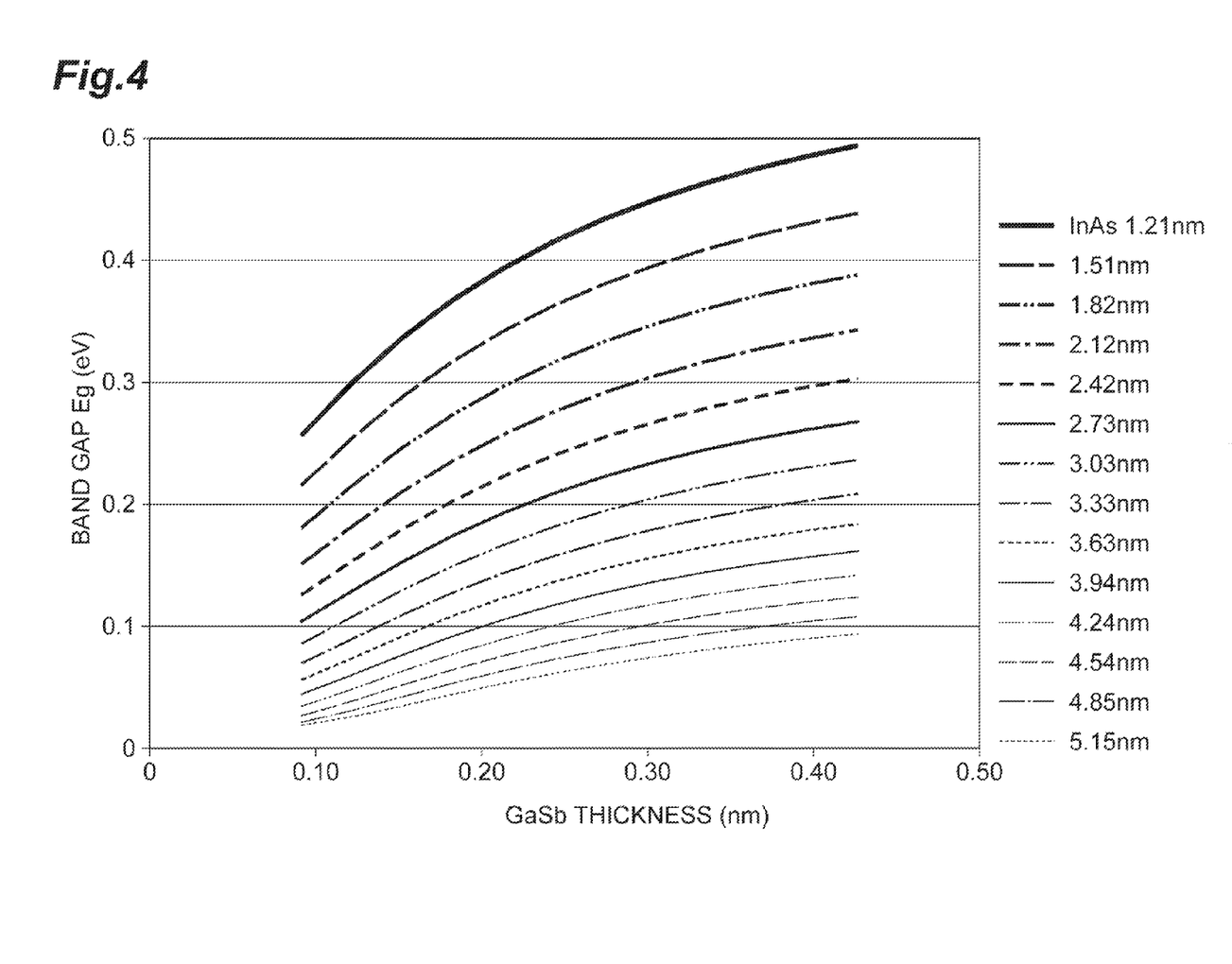
FIG. 4 is a graphical view showing a relationship between the thickness of GaSb in a InSb/InAs/GaSb cell for a superlattice composed of three layers, and the band gap of the superlattice made of the cells

FIG. 4 is a view showing the relationship between a GaSb thickness in an InSb/InAs/GaSb cell and the band gap of the superlattice containing the cell. The horizontal axis indicates the thickness of the GaSb in the cell (nm), and the vertical axis indicates the gap Eg of the superlattice band. The InSb has, for example, a thickness corresponding to the monolayer (a single layer). The gap Eg of the superlattice band has a dependency on the GaSb thickness as independent variable, which is shown for each of the following thicknesses of InAs: 1.21 nm, 1.51 nm, 1.82 nm, 2.12 nm, 2.42 nm, 2.73 nm, 3.03 nm, 3.33 nm, 3.63 nm, 3.94 nm, 4.24 nm, 4.85 nm, and 5.15 nm. Note that these values are estimated at room temperature.
GaSb: lattice constant (0.60959 nm), the band gap (0.726 electron volts).
InAs: lattice constant (0.60583 nm), the band gap (0.354 electron volts).
InSb: lattice constant (0.64794 nm), the band gap (0.17 electron volts).
The example in FIG. 4 shows that the gap Eg can range from 0.02 electron volts to 0.5 electron volts. In the present embodiment, the first superlattice structure 31 of the light absorbing layer 13, the third superlattice structure 35 of the p-type semiconductor region 17, and the fourth superlattice structure 37 of the n-type semiconductor region 19 have the same laminated structure, and the second superlattice structure 33 of the intermediate layer 15 has a laminated structure different from these superlattices, allowing the formation of a well potential in the conduction band.

The estimate shown in FIG. 4 allows the designing of the gap Eg in each of the first superlattice structure 31 of the light absorbing layer 13, the second superlattice structure 33 of the intermediate layer 15, the third superlattice structure 35 of the n-type semiconductor region 19, and the fourth superlattice structure 37 of the p-type semiconductor region 17, thereby obtaining respective desired values.

In the present embodiment, the second superlattice structure 33 of the intermediate layer 15 has an arrangement of unit cells (52 cells) of InSb (a thickness of 0.27 nm)/InAs (a thickness of 5.06 nm)/InSb (a thickness of 0.27 nm)/GaSb (a thickness of 2.10 nm), and the third superlattice structure 35 of the p-type semiconductor region 17 has an arrangement of unit cells (50 cells) each of which includes InSb (a thickness of 0.27 nm)/InAs (a thickness of 2.74 nm)/GaSb (a thickness of 2.13 nm). In these cells, InSb is used to reduce lattice strain therein. The second semiconductor layer 33b of the intermediate layer 15 (5.06 nm-thick InAs) is thicker than the second semiconductor layer 35b of the p-type semiconductor regions 17 (2.74 nm-thick InAs). In this laminated structure, the relationships in thickness between the second semiconductor layer 33b of the intermediate layer 15 and the second semiconductor layer 35b the n-type semiconductor region 19 makes it easy that the energy level at the bottom of the conduction band of the intermediate layer 15 is lower than that of the p-type semiconductor region 19.

The first superlattice structure 31 of the light absorbing layer 13 has an arrangement of unit cells (200 cells) each of which includes InSb (a thickness of 0.27 nm)/InAs (a thickness of 2.74 nm)/GaSb (a thick of 2.13 nm). The second superlattice structure 33 of the intermediate layer 15 has an arrangement of unit cells (52 cells) each of which includes InSb (a thick of 0.27 nm)/InAs (a thick of 5.06 nm)/InSb (a thick of 0.27 nm)/GaSb (a thick of 2.10 nm). The second semiconductor layer 33b of the intermediate layer 15 (5.06 nm-thick InAs) is thicker than the first semiconductor layer 31b of the light absorbing layer 13 (2.74 nm-thick InAs) in thickness. In this laminated structure, the thickness relationship between the first semiconductor layer 31b and the second semiconductor layer 33b makes it easy that the bottom energy level of the conduction band of the light absorbing layer 13 is higher than that of the intermediate layer 15. Further, the first semiconductor layer 31a of the light absorbing layer 13 (2.13 nm-thick GaSb) has approximately the same thickness as the second semiconductor layer 33a of the intermediate layer 15 (2.10 nm-thick GaSb). The laminated structure can obtain a desired band gap while keeping the offset of the valence band small.

The difference between the bottom of the valence band and the bottom of the conduction band in the intermediate layer 15 (i.e., the band gap of the intermediate layer 15) is smaller than the difference between the bottom of the valence band and the bottom of the conduction band of the light absorbing layer 13 (i.e., the band gap of the light absorbing layer 13). The photodiode allows the conduction band of the intermediate layer 15 to form a well potential to electron, and allows the valence band of the intermediate layer 15 and not to form a large band offset preventing holes of electron-hole pairs, which are generated by photoelectric conversion in the light absorbing layer 13, from flowing therethrough.

The intermediate layer 15 may have a p-type conductivity. The p-type conductivity of the intermediate layer 15 is effective in making Fermi level in the band structure of the intermediate layer 15 close to the valence band, thereby making the band offset in the valence band at the interface between the intermediate layer 15 and the light absorbing layer 13 smaller or substantially to zero.

The intermediate layer 15 may have a hole concentration of $4.8 \times 10^{16}$ cm$^{-3}$ or more, and $2.6 \times 10^{17}$ cm$^{-3}$ or less. In addition, the p-type semiconductor region 17 may have a hole concentration of $1 \times 10^{17}$ cm$^{-3}$ or more, and $2 \times 10^{17}$ cm$^{-3}$ or less. This hole concentration, allows the band offset in the valence band between the intermediate layer 15 and the p-type semiconductor region 17 to be within 17 milli-electron volts ($k_B T$ at an absolute temperature of 200 K).

EXAMPLE

In the examples, photodiodes having the structure 1, structure 2, and structure 3 are produced as follows. Crystal growth to form them is carried out by molecular beam epitaxy. The above structures are formed on Te-doped n-type GaSb substrates. Specifically, a Be-doped p-type GaSb layer of a thickness of 1000 nm is grown on each n-type GaSb substrate. Each of the above structures is grown on the p-type GaSb layer, and an n-type InAs layer having a thickness of 20 nm is grown on the structure thus grown.

Structure 1 (PtIN structure).
Cell for the fourth superlattice structure of the n-type semiconductor region (Si-doped): InSb (a thickness of 0.27 nm)/InAs (a thickness of 2.74 nm)/GaSb (a thickness of 2.13 nm).
The number of cells stacked: 50.
Cell for the first superlattice structure of the light absorbing layer (Be-doped): InSb(a thickness of 0.27 nm)/InAs (a thickness of 2.74 nm)/GaSb (a thickness of 2.13 nm).
The number of cells stacked: 200.
Cell for the second superlattice structure of the intermediate layer (Be-doped): InSb(a thickness of 0.27 nm)/InAs (a thickness of 5.06 nm)/InSb (a thickness of 0.27 nm)/GaSb (a thickness of 2.10 nm).
The number of cells stacked: 52.
Cell for the third superlattice structure of the p-type semiconductor region (Be-doped): InSb (a thickness of 0.27 nm)/InAs (a thickness of 2.74 nm)/GaSb (a thickness of 2.13 nm).
The number of cells stacked: 200.
The cell for the superlattice structure of the light absorbing layer, the cell for the superlattice structure of the n-type semiconductor region, and the cell for the superlattice structure of the p-type semiconductor region have the same structure, and the pn junction is disposed at or around the boundary between the light absorbing layer and the n-type semiconductor region. The intermediate layer is disposed between the GaSb substrate and the light absorbing layer. The above structure allows the intermediate layer to capture electrons, which move in the direction from the p-type semiconductor region to the intermediate layer, without interfering with the photocurrent generated by the light absorption layer, and can prevents the degradation of the sensitivity of the photodiode.

Structure 2 (PIN Structure).
Cell for the superlattice structure of the n-type semiconductor region (Si-doped): InSb(a thickness of 0.27 nm)/InAs (a thickness of 2.74 nm)/GaSb (a thickness of 2.13 nm).
The number of cells stacked 50.
Cell for the superlattice structure of the light absorbing layer (Be-doped): InSb (a thickness of 0.27 nm)/InAs (a thickness of 2.74 nm)/GaSb (a thickness of 2.13 nm).
The number of cells stacked: 200.
Cell for the superlattice structure of the p-type semiconductor region (Be-doped): InSb (a thickness of 0.27 nm)/InAs (a thickness of 2.74 nm)/GaSb (a thickness of 2.13 nm).
The number of cells stacked: 200.
Structure 3 (PbIbN structure).
Cell for the superlattice structure of the n-type semiconductor region (Si-doped): InSb(a thickness of 0.27 nm)/InAs (a thickness of 2.74 nm)/GaSb (a thickness of 2.13 nm).
The number of cells stacked: 50.
Cell for the superlattice structure of the hole barrier layer (Si-doped): InSb (a thickness of 0.17 nm)/InAs (a thickness of 3.03 nm)/GaSb (a thickness of 0.305 nm)/AlSb (a thickness of 1.53 nm)/GaSb (a thickness of 0.305 nm).
The number of cells: 60.
Cell for the superlattice structure of the light absorbing layer (Be-doped): InSb (a thickness of 0.27 nm)/InAs (a thickness of 2.74 nm)/GaSb (a thickness of 2.13 nm).
The number of cells stacked: 200.
Cell for the superlattice structure of the electronic barrier layer (undoped): InSb (a thickness of 0.27 nm)/InAs (a thickness of 1.21 nm)/GaSb (a thickness of 3.66 nm)/InAs (a thickness of 1.21 nm)/GaSb (a thickness of 3.66 nm).
The number of cells stacked: 16.
Cell for the superlattice structure of the p-type semiconductor regions (Be-doped): InSb (a thickness of 0.27 nm)/InAs (a thickness of 2.74 nm)/GaSb (a thickness of 2.13 nm).
The number of cells stacked: 50.

Figure 5:
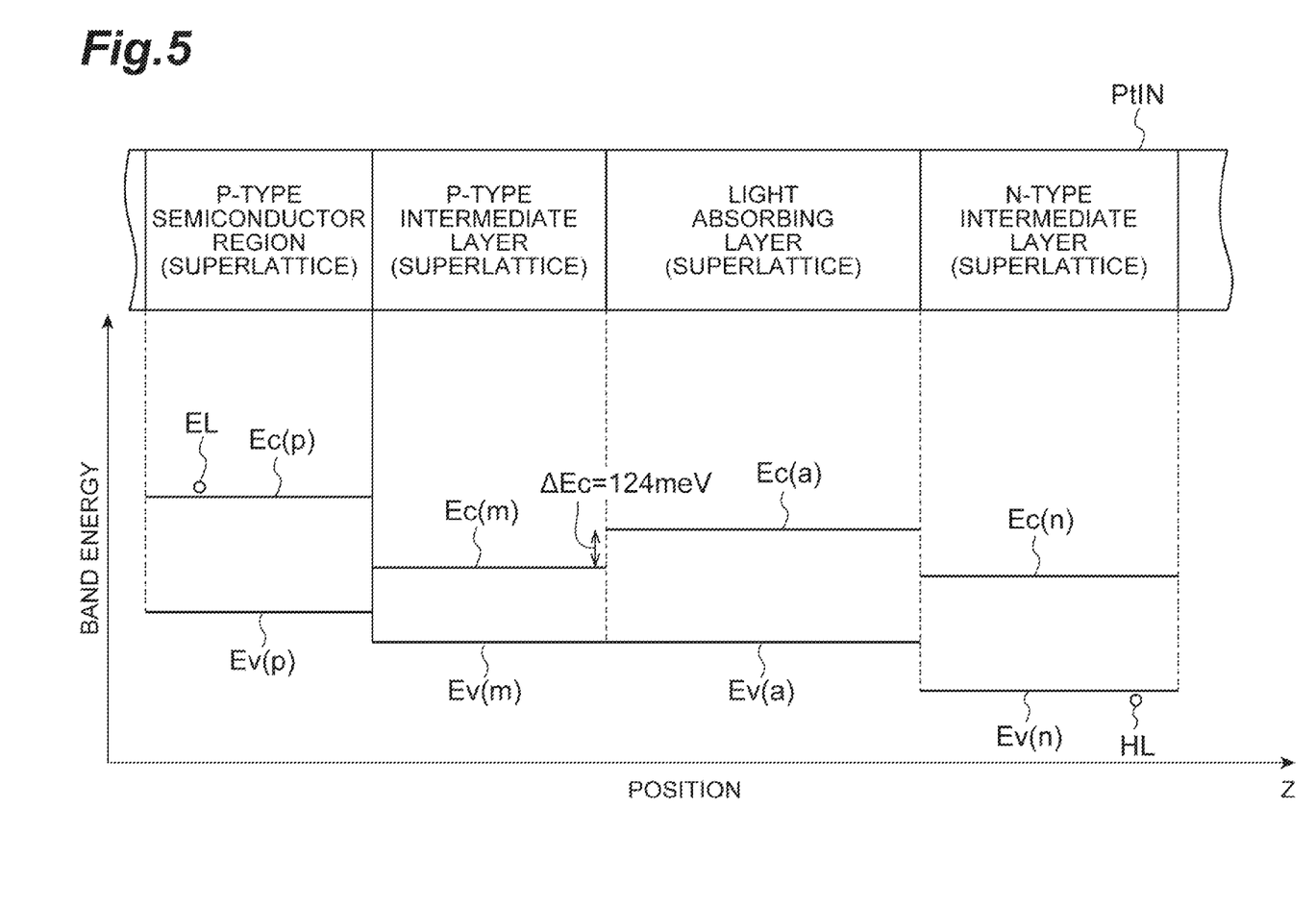
FIG. 5 is a view showing a band diagram of the structure 1 (PtIn structure).
Figure 6:
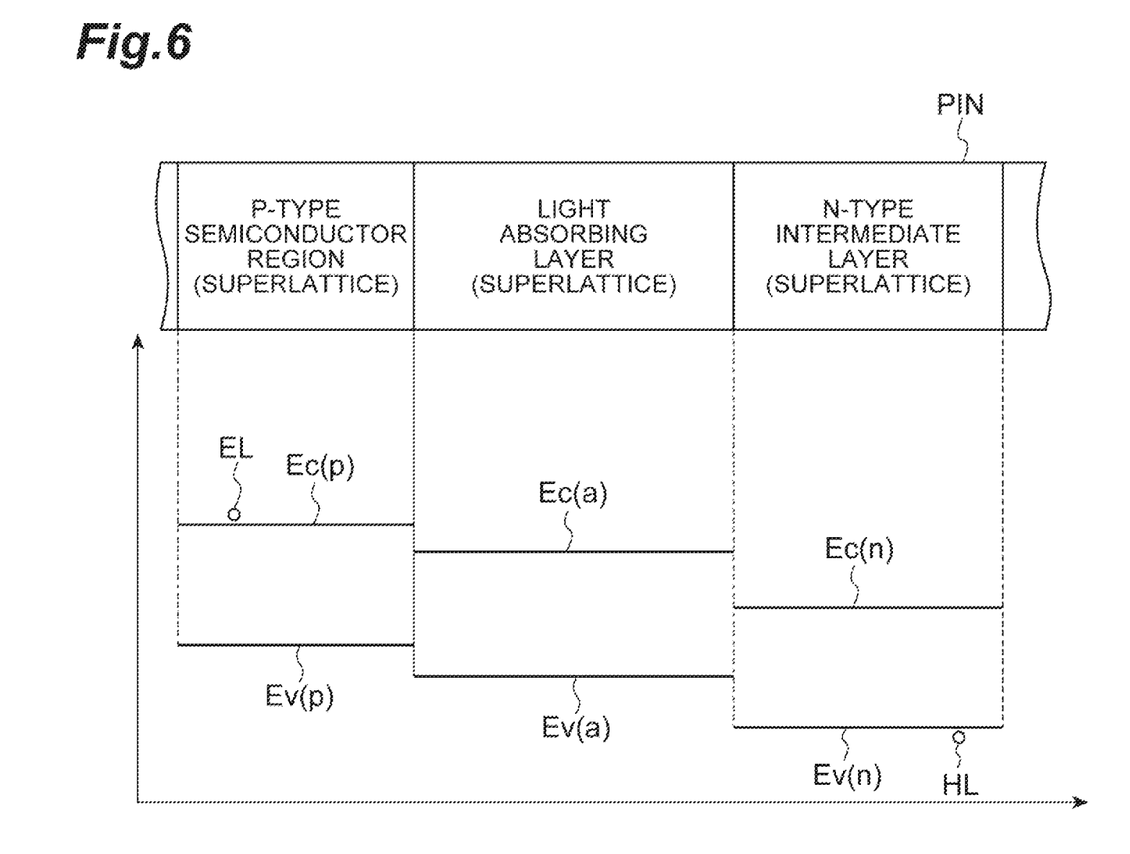
FIG. 6 is a view showing a band diagram of the structure 2 (PIN structure).
Figure 7:
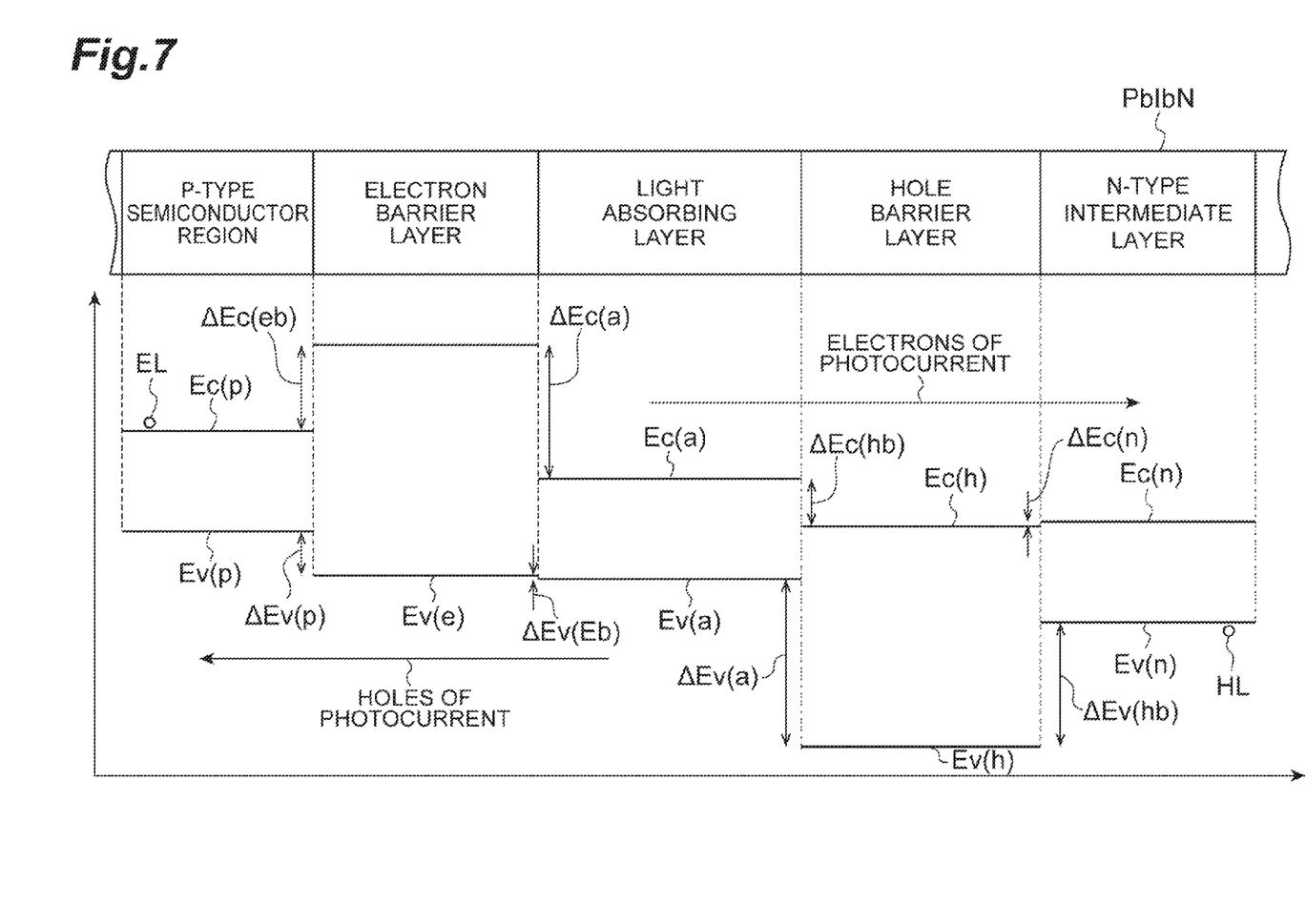
FIG. 7 is a view showing a band diagram of the structure 3 (PbIbN structure).

FIGS. 5, 6 and 7 show the band diagrams of the structure 1 (PtIn structure), the structure 2 (PIN structure) and structure 3 (PbIbN structure), respectively. For making comparison easy, the structure 1 (PtIN structure), the structure 2 (PIN structure) and the structure 3 (PbIbN structure) include the same cell for the superlattice structure of the p-type semiconductor region, the same cell for the superlattice structure of the light absorbing layer, and the same cell for the superlattice structure of the n-type semiconductor region. As shown in FIG. 5, the structure 1 (PtIN structure) enables the structure according to the present embodiment, and the depth of the well potential of the intermediate layer (the band offset) ΔEc is 124 meV. The structure 2 (PIN structure), as shown in FIG. 6, has the simplest light sensing structure of the three structures. The structure 3 (PbIbN structure), as shown in FIG. 7, has an electron barrier layer for electron and a hole barrier layer for hole, the band offset at the individual junctions are the following values.
ΔEc(eb): 218 to 185 meV.
ΔEc(a): 320 to 287 meV.
ΔEc(hb): 90 to 110 meV.
ΔEc(n): 6 meV.
ΔEv(hb): 264 meV.
ΔEv(a): −2 to 10 meV.
ΔEv(eb): 2 to 10 meV.
ΔEv(p): 6 meV.

Figure 8A:
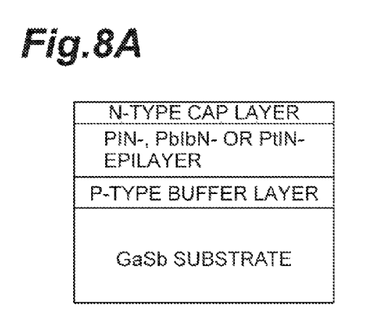
FIGS. 8A to 8F are schematic views each showing a major step in a method for producing a photodiode for the structures 1 to 3.

With reference to FIGS. 8A to 8F, a method for fabricating the structures 1 to 3 will be described below. The three GaSb substrates are prepared. As shown in FIG. 8A, a Be-doped p-type GaSb buffer layer having a thickness of 1000 nm is grown on each GaSb substrate by molecular beam epitaxy. Thereafter, epitaxial growth for each of the structure 1, the structure 2 and the structure 3 are performed, and an n-type InAs cap layer having a thickness of 20 nm is grown on the individual structure. These growth steps produce three epitaxial substrates. In the epitaxial growth, silicon is used as a dopant for n-type conductivity, and beryllium is used as a dopant for p-type conductivity.

Figure 8B:
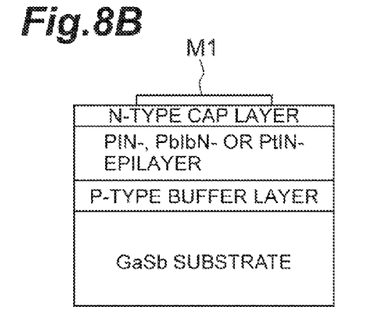
Figure 8C:
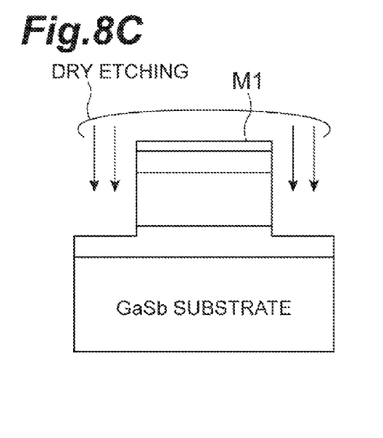
Figure 8D:
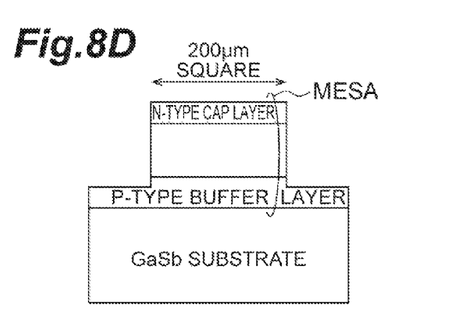
Figure 8E:
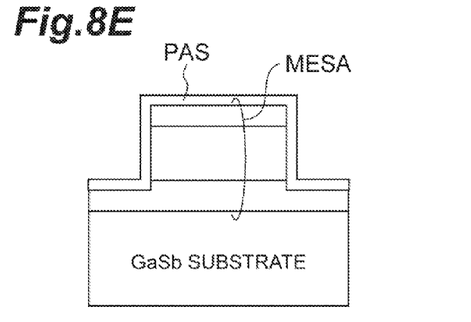
Figure 8F:
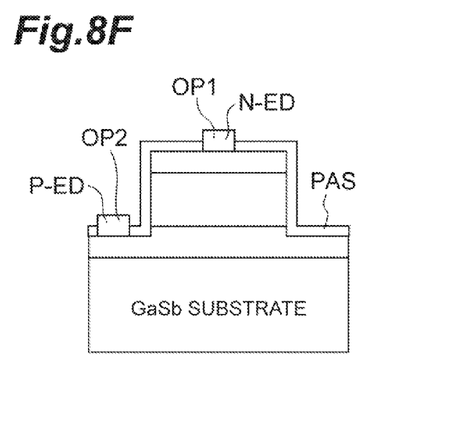

As shown in FIG. 8B, a mask M1 for defining a semiconductor mesa is formed on the individual epitaxial substrate. The mask M1 has a pattern of a square with each side of 200 micrometers and is made of, for example, SiN. As shown in FIG. 8C, the individual epitaxial substrate is etched using the mask M1 to form a semiconductor mesa MESA. Etching is performed to such a depth as to reach the p-type buffer layer to expose a surface of the p-type buffer layer. After the dry etching, as shown in FIG. 8D, the mask M1 is removed using a buffered hydrofluoric acid. After the removal, as shown in FIG. 8E, the silicon oxide film PAS (SiO$_2$ film with a thickness of 300 nm) is deposited so as to cover the exposed surface of the p-type buffer layer and the surface of the semiconductor mesa MESA. After the growth of the silicon oxide film PAS, as shown in FIG. 8F, a first opening OP1 and a second opening OP 2 are formed on the top of the p-type buffer layer and the surface of the semiconductor mesa MESA, respectively. An n-side electrode N-ED and a p-side electrode P-ED are formed on the first opening OP1 and the second opening OP2, respectively. The n-side electrode N-ED and the p-side electrode P-ED are composed of platinum (Pt). These steps complete the three types of photodiodes.

Figure 9:
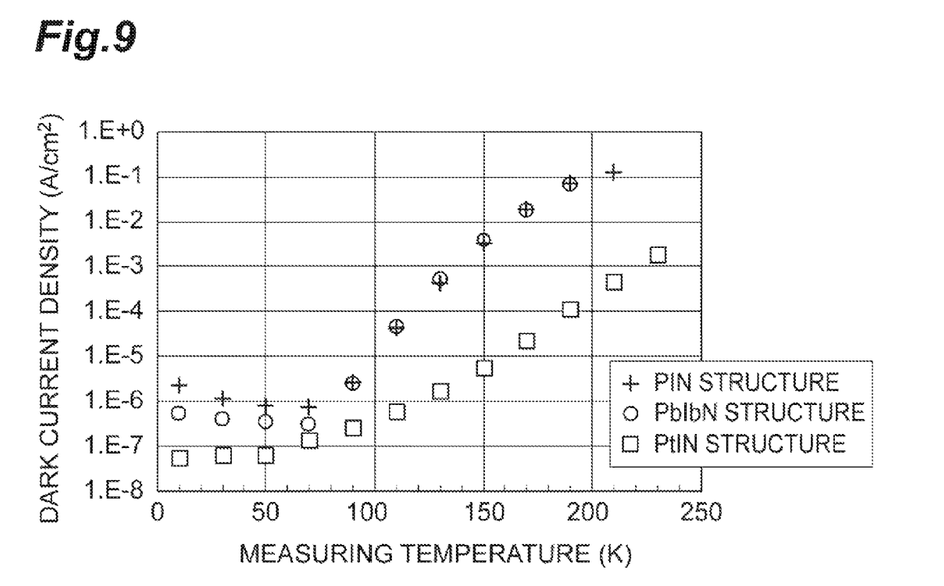
FIG. 9 is a graphical view showing the temperature dependence of dark current in the structure 1 (PtIN structure), the photodiode having the structure 2 (PIN structure) and the structure 3 (PbIbN structure).

Dark current of photodiodes having the structure 1 (PtIn structure), the structure 2 (PIN structure) and structure 3 (PbIbN structure) is measured. FIG. 9 shows the temperature dependence of dark current in the photodiodes having the following structures: the structure 1 (PtIn structure); the structure 2 (PIN structure); and the structure 3 (PbIbN structure). Compared to the photodiode of the PIN structure, the photodiode of the PbIbN structure exhibits a lower dark current density in temperatures lower than the absolute 77 Kelvin (K). The photodiodes having the structures PbIbN and the PIN structure exhibit substantially the same dark current density in temperatures higher than the absolute 77 Kelvin (K). This result indicates that the barrier of the PbIbN structure does not effectively work in temperatures higher than the absolute temperature 77 Kelvin (K). In contrast, the photodiode of the PtIN structure exhibits a dark current density smaller than the photodiode and the photodiode of PbIbN structure of the PIN structure in temperatures lower than the absolute 77 Kelvin (K). The dark current density of the photodiode of the PtIN structure is smaller compared to the photodiodes of the PbIbN structure and the PIN structure in temperatures higher than the absolute temperature 77 Kelvin (K). FIG. 9 shows that the well potential of the PtIN structure works effectively in temperatures higher than the absolute 77 Kelvin (K).

On the basis of an acceptable upper dark current density of $1 \times 10^{-4}$ A/cm$^2$, photodiodes of the PIN structure and the structure PbIbN can be used in an absolute temperature of 120 Kelvin (K) or lower in terms of the dark current density, and the photodiode of the PtIN structure can be used in an absolute temperature 190 Kelvin (K) or lower. Cooling to an absolute temperature of 120 Kelvin (K) requires a refrigerator, such as a Stirling cooler, and a four-stage Peltier cooler enables cooling to an absolute temperature of 190 Kelvin. Hence, photodiodes of the PtIN structure can contribute to downsizing and cost reduction of the infrared detector.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:
1. A photodiode comprising:
a light absorbing layer including a first superlattice structure that includes first semiconductor layers and second semiconductor layers, the first superlattice structure having a band structure sensitive to infrared light;
a p-type semiconductor region; and
an intermediate layer including a second superlattice structure that includes first semiconductor layer and second semiconductor layers, the intermediate layer being disposed between the p-type semiconductor region and the light absorbing layer, the intermediate layer having a conduction band having a bottom energy level lower than that of the p-type semiconductor region, wherein
the first superlattice structure of the light absorbing layer has an array of unit cells each of which includes the first semiconductor layers and the second semiconductor layers of the first superlattice structure,
each of the first semiconductor layers of the first superlattice structure contains gallium as a group III element, and antimony as a group V element,
each of the second semiconductor layers of the first superlattice structure contains indium as a group III element, and arsenic as a group V element,
the second superlattice structure of the intermediate layer has an array of unit cells each of which includes the first semiconductor layers and the second semiconductor layers of the second superlattice structure,
the conduction band of the intermediate layer is provided by the second superlattice structure,
each of the first semiconductor layers of the second superlattice structure contains gallium as a group III element, and antimony as a group V element, and
each of the second semiconductor layers of the second superlattice structure contains indium as a group III element, and arsenic as a group V element.

2. The photodiode according to claim 1, wherein
the p-type semiconductor region has a conduction band provided by a third superlattice structure, and
the conduction band of the intermediate layer has a bottom energy level lower than that of the light absorbing layer.

3. The photodiode according to claim 1, wherein the intermediate layer has a p-type conductivity.

4. A photodiode comprising:
a light absorbing layer including a first superlattice structure that includes first semiconductor layers and second semiconductor layers, the first superlattice structure having a band structure sensitive to infrared light;
a p-type semiconductor region having a conduction band provided by a second superlattice structure; and
an intermediate layer disposed between the p-type semiconductor region and the light absorbing layer, the intermediate layer having a conduction band having a bottom energy level lower than that of the p-type semiconductor region and lower than that of the light absorbing layer.

5. A photodiode comprising:
a light absorbing layer including a first superlattice structure that includes first semiconductor layers and second semiconductor layers, the first superlattice structure having a band structure sensitive to infrared light;
a p-type semiconductor region; and
an intermediate layer including a second superlattice structure that includes first semiconductor layers and second semiconductor layers, the intermediate layer being disposed between the p-type semiconductor region and the light absorbing layer, the intermediate layer having a conduction band having a bottom energy level lower than that of the p-type semiconductor region, wherein each of the first semiconductor layers of the first superlattice structure contains gallium as a group III element, and antimony as a group V element, each of the second semiconductor layers of the first superlattice structure contains indium as a group III element, and arsenic as a group V element, the conduction band of the intermediate layer is provided by the second superlattice structure, each of the first semiconductor layers of the second superlattice structure contains gallium as a group III element, and antimony as a group V element, and each of the second semiconductor layers of the second superlattice structure contains indium as a group III element, and arsenic as a group V element.

6. The photodiode according to claim 5, wherein the p-type semiconductor region has a conduction band provided by a third superlattice structure, and the conduction band of the intermediate layer has a bottom energy level lower than that of the light absorbing layer.

7. The photodiode according to claim 5, wherein the intermediate layer has a p-type conductivity.

8. A photodiode comprising:

a light absorbing layer including a first superlattice structure;

a p-type semiconductor region; and an intermediate layer including a second superlattice structure that includes first semiconductor layers and second semiconductor layers, the intermediate layer being disposed between the p-type semiconductor region and the light absorbing layer, and having a conduction band, the conduction band of the intermediate layer having a bottom energy level lower than that of the p-type semiconductor region, wherein the first superlattice structure has unit cells, each of the unit cells including a first semiconductor layer and a second semiconductor layer, the unit cells being arranged to form a band structure sensitive to infrared light, the first semiconductor layers of the first superlattice structure contain gallium as a group III element, and antimony as a group V element, the second semiconductor layers of the first superlattice structure contain indium as a group III element, and arsenic as a group V element, the conduction band of the intermediate layer is provided by the second superlattice structure, each of the first semiconductor layers of the second superlattice structure contains gallium as a group III element, and antimony as a group V element, and each of the second semiconductor layers of the second superlattice structure contains indium as a group III element, and arsenic as a group V element.

9. The photodiode according to claim 8, wherein the p-type semiconductor region has a conduction band provided by a third superlattice structure, and the conduction band of the intermediate layer has a bottom energy level lower than that of the light absorbing layer.

10. The photodiode according to claim 8, wherein the intermediate layer has a p-type conductivity.

* * * * *